United States Patent [19]
Talbot

[11] Patent Number: 4,894,744
[45] Date of Patent: Jan. 16, 1990

[54] INFORMATION HANDLING AND CONTROL SYSTEMS, AND METHODS OF TESTING THE CONDITION OF ELECTRICAL LOADS IN SUCH SYSTEMS

[75] Inventor: Kevin T. Talbot, Lichfield, England

[73] Assignee: Salplex Limited, England

[21] Appl. No.: 240,678

[22] Filed: Sep. 6, 1988

[30] Foreign Application Priority Data

Sep. 21, 1987 [GB] United Kingdom ............ 8722195

[51] Int. Cl.⁴ ............................................. H02H 3/20
[52] U.S. Cl. .................................. 361/91; 361/100; 361/111; 307/10.1
[58] Field of Search ............... 361/56, 57, 54, 100, 361/103, 106, 111, 91; 307/29, 10 R, 10 BP, 41; 340/643, 651; 315/82

[56] References Cited

U.S. PATENT DOCUMENTS

| | | | |
|---|---|---|---|
| 4,142,115 | 2/1979 | Nakata et al. | 361/103 |
| 4,435,648 | 3/1984 | Goode | 307/10 R |
| 4,574,266 | 3/1986 | Valentine | 340/52 F |
| 4,575,673 | 3/1986 | Teschi et al. | 307/10 R |
| 4,733,100 | 3/1988 | Nusairat et al. | 307/10 BR |

Primary Examiner—Todd E. Deboer
Attorney, Agent, or Firm—Kirschstein, Ottinger, Israel & Schiffmiller

[57] ABSTRACT

In a multiplex system for automotive vehicles, battery (+V) current is supplied to a load (70) connected to a non-intelligent slave unit (20) via a power switch (TR) in the slave controlled by a capacitor (CT) which is charged or discharged in an assigned time slot by high or low drive voltage applied on a low current signal line (42) from a remote intelligent unit (10). If the load (70) goes short-circuit then a thyristor (TH) adjacent the power switch (TR) turns on to turn off the power switch (TR) and provide a discharge path for the capacitor (CT) via the load (70), this discharged condition being detected at the remote intelligent unit during an assigned load driving time slot. Thus a dedicated extra channel (time slot) is not required at the slave unit for short-circuit testing of the load.

8 Claims, 1 Drawing Sheet

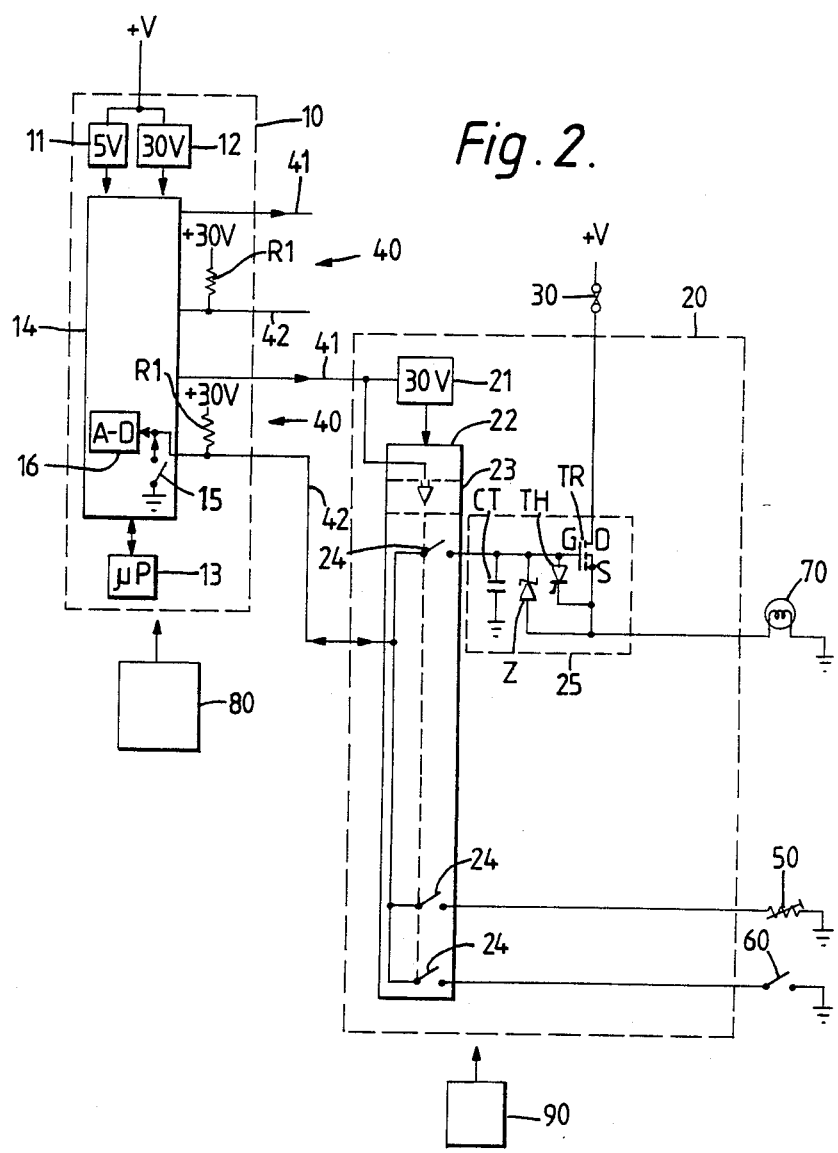

INFORMATION HANDLING AND CONTROL SYSTEMS, AND METHODS OF TESTING THE CONDITION OF ELECTRICAL LOADS IN SUCH SYSTEMS

BACKGROUND OF THE INVENTION

1. Field of the Invention

This invention relates to information handling and control systems, and to methods of testing the condition of electrical loads in such systems.

2. Description of Related Art

An example of such a system in the form of an automotive vehicle electrical system is known from the article "Multiplexing for the automotive industry" by W. R. Betts in GEC REVIEW, Vol. 2, No. 1, 1986 at pages 32 to 36.

FIG. 1 of the accompanying drawings is an overall schematic diagram corresponding to the Figure shown on page 34 of the GEC REVIEW article.

In FIG. 1 there is shown a star wired system with an intelligent, central, master unit 10 and a number of non-intelligent, local, slave units 20. Power from a battery +V is supplied to the master unit 10 and via fuses 30 to the slave units 20. A low current signalling link 40 is connected from the master unit 10 to each slave unit 20. Electrical switches, sensors, and high current loads (not shown in FIG. 1) are connected to the slave units 20 and their interaction is controlled from the master unit 10 by means of time slot assignment multiplex.

In the GEC REVIEW article it is mentioned that each signalling bus (link) has a clock line and a data (signal) line. The clock line carries bursts of clock pulses, usually eight or sixteen pulses per burst which define the time slots for the data line. For sixteen time slots each slave unit thus provides sixteen interfaces (channels), and during each time slot a single digital data bit or analogue level is transferred between that slave and the master on the data line, for example a command from the master to the slave to operate a load, such as a lamp or a motor, or an indication of the state of a load from the slave to the master. In a discussion of testability on page 36 of this article it is mentioned that by monitoring the current drawn from the battery the state of each load can be individually checked. This implies that a dedicated separate one of the slave channels is required for testing each load and this implication is confirmed by a block diagram of the slave unit on page 35 of this article which shows one group of channels connected to loads via an "outputs" block and these loads connected via a "diagnostics" block to a separate group of channels.

For a system having a given number of channels provided at each slave unit as described above, then for each slave unit to which it is required to connect one or more loads the provision of a separate test channel for each load is disadvantageous in limiting the number of loads and possibly also switches and sensors which can be connected to the slave unit.

SUMMARY OF THE INVENTION

An object of the present invention is to overcome the disadvantage just mentioned for short-circuit detection of loads.

According to the invention there is provided an information handling and control system comprising:

(a) a power switch provided in a local unit to control a high current to a load;
(b) a low current signalling link provided between the local unit and a remote intelligent unit;
(c) a capacitor provided in the local unit connected to the power switch control electrode;
(d) means provided in the local unit for connecting the capacitor to the signalling link during a time slot assigned to the power switch in successive frame periods;
(e) drive voltage means provided in the intelligent unit for applying a first or a second drive voltage within a said assigned time slot respectively to charge or discharge said capacitor to a high or a low voltage value sufficient respectively to turn the power switch on or off, the capacitor maintaining the power switch continuously on or continuously off between successive frame periods when the load is in normal condition;
(f) power switch protection means connected to the power switch and to the capacitor, the protection means being non-conductive when the load is in normal condition and becoming conductive when the power switch is on with the load in short-circuit condition, such that when the protection means is conductive the capacitor discharges to said low voltage value via the protection means and the power switch turns off;
(g) detection means provided in the intelligent unit which are operable to detect the condition of the capacitor at a time in a selected said assigned time slot when the capacitor will be at said low voltage value only if the load is in a short-circuit condition and hence to detect whether or not the load is in short-circuit condition.

It will be appreciated that in a system according to the invention the protection means may in any case be present to protect each power switch, and so no extra circuitry is required at the local unit for short-circuit testing of each load. The detection means in the intelligent unit may consist of an analogue-to-digital converter and a microprocessor which are in any case present to detect the condition of sensors attached to local units of the system and so only additional suitable programming of the microprocessor is required in the intelligent unit for the short-circuit testing function.

The power switch protection means may comprise a semiconductor switch thermally connected to the power switch such that the semiconductor switch becomes conductive above a predetermined temperature responsive to heat generated in the power switch. The semiconductor switch may be a thyristor.

The protection means may be connected such that the capacitor discharges via the protection means and via the load.

It should be mentioned that it is a known failure mode of triacs and thyristors that they will turn on above a certain temperature. It is furthermore known, from Patent Document EP 208970A to use this characteristic to provide temperature protection for a MOSFET transistor by having a thyristor thermally connected to the transistor with the two main electrodes of the thyristor connected across the gate and source electrodes of the transistor. The thyristor is designed to turn on before a temperature, which may be between 130° and 180° C., critical for the MOSFET is reached. However, this disclosure of passive protection of a transistor does not in any way indicate the possiblity of connecting the thyristor to a capacitor in the local unit of a remote control system such that the state of the capacitor both controls the transistor and provides information readback on the condition of a load connected to the transistor.

An information handling and control system according to the invention may be included in an automotive vehicle electrical system.

In a system according to the invention, the frequency at which short-circuit testing is performed may be selected to meet particular requirements. Thus the detection means may be operable to detect whether or not the load is in short-circuit condition in selected frame periods at intervals of a selected plurality of frame periods.

According to the invention there is also provided a method of testing said load in a system as described above, in which said drive voltage means are operated under control of test equipment connected to the intelligent unit, in which each said selected time slot is selected and said detection means are operated under control of said test equipment, and in which the test equipment registers whether or not the load is in short-circuit condition.

According to the invention there is also provided a local unit for use in a system as described above, said local unit comprising said power switch, said capacitor, said means for connecting the capacitor to the signalling link, and said power switch protection means.

According to the invention there is further provided a method of testing said load connected to said power switch in a local unit as just described before assembly of the local unit in the system, in which said low current signalling link is provided between the local unit and test equipment, in which said drive voltage means are reproduced in and are operated under control of the test equipment, in which said detection means are reproduced in the test equipment and each said selected time slot is selected and said detection means are operated under control of the test equipment, and in which the test equipment registers whether or not the load is in short-circuit condition.

BRIEF DESCRIPTION OF THE DRAWINGS

The invention will now be described in more detail with reference to the accompanying drawings, in which:

FIG. 1, which has already been described above in relation to a known prior art system, also serves as an overall schematic diagram applicable to the system of the invention, and FIG. 2 shows details of the system of FIG. 1 incorporating the features of the invention.

DETAILED DESCRIPTION OF THE PREFERRED EMBODIMENTS

Referring now to FIG. 2, the master unit 10 includes 5 volt and 30 volt power supplies 11, 12 fed by the battery +V which is 12 volts in an automotive vehicle electrical system. The power supplies 11, 12 are fed to a microprocessor 13 and a custom unit 14 connected thereto in the master unit 10. Each low current signalling link 40 to a slave unit 20 includes a clock pulse line 41 and a signal line 42. The clock pulses on the lines 41 are of 30 volts amplitude and control the timing of the system time slot assignment multiplex. Within each time slot drive voltage means 15 in the custom unit 14 connected to each signal line 42 apply at any one time a first drive voltage or a second drive voltage to that signal line 42. The drive voltage means 15 is a drive voltage circuit shown schematically as a switch. The first drive voltage corresponds to the open switch position shown as applying the fixed voltage of 30 volts via a pull-up resistor R1 and the second drive voltage corresponds to the closed switch position shown as applying zero volts.

In each slave unit 20, one of which is shown in FIG. 2, a 30 volt power supply 21 is derived from the clock pulses on the line 41. A demultiplexing unit 22 has timing circuits 23 responsive to the clock pulses on the line 41 and from which switches 24 are operated to connect the low current signalling link of the signal line 42 through a corresponding channel in the appropriate assigned time slot. Each slave unit 20 can connect for example sixteen channels, three of which are shown in FIG. 2.

A variable resistive sensor 50 is shown wired to one of the channels in the slave unit 20. With the sensor 50 connected in the signal line 42 during the appropriate assigned time slot and the drive voltage circuit 15 in the master unit 10 applying the first drive voltage during that time slot, then the voltage on the signal line 42 is an input signal from the sensor 50 due to its resistance, and this input signal is recognised via an analogue-to-digital converter 16 in the master unit 10.

An electrical switch 60 is shown wired to another of the channels in the slave unit 20. With the switch 60 connected in the signal line 42 during the appropriate assigned time slot and the drive voltage circuit 15 in the master unit 10 applying the first drive voltage during that time slot, then the voltage on the signal line 42 due to the resistance between two terminals of the switch 60 is recognised via the analogue-to-digital converter 16 in the master unit 10 as a binary input signal from the switch 60.

One other channel in the slave unit 20 is shown connected in the slave unit to an output circuit 25. The state of the drive voltage circuit 15 during the appropriate assigned time slot will provide an output signal on the signal line 42 to the output circuit 25 to control a high current from the battery +V via a fuse 30 to a load 70, for example a lamp, wired to the slave unit 20.

The microprocessor 13 in the master unit 10 ensures that the output signal on a signal line 42 to control a high current to a particular load 70 connected to any one of the slave units 20 is in response to an input signal from a particular switch 60 which is to be associated with that load 70 and is connected to any one of the slave units 20.

The low currents in the low current signalling links of the system, for example through the signal line 42 to the switch 60 or to the output circuit 25 may be, for example, not greater than 5 mA. The high currents through the loads of the system, for example to the load 70 controlled in response to operation of the switch 60 may be, for example, up to 10 amps.

Referring again to the output circuit 25, the passage of high current from the battery +V to the load 70 when that load is in normal condition is controlled by the on or off condition of a power switch TR in the form of a power MOSFET transistor having its drain electrode D connected to the battery +V and its source electrode S connected to the load 70. A capacitor CT is connected to the control electrode G of the power switch TR, and the demultiplexing unit 22 connects the capacitor CT to the signal line 42 during a time slot, for example 100 μs, assigned to the power switch TR in successive frame periods, for example at 100 Hz. Within each time slot assigned to the power switch TR, the drive voltage circuit 15 applies the first drive voltage or the second drive voltage to charge or discharge the capacitor CT to a high or a low voltage value sufficient respectively to turn the power switch TR on or off. The high voltage value of the capacitor CT is approximately 20 volts determined by the battery +V voltage of approximately 12 volts and by a zener diode Z connected between the capacitor CT and the load 70 to protect the MOSFET power switch TR by limiting its Vgs to approximately 8 volts. The low voltage value of the capacitor CT is zero volts. The leakage in the system is arranged to be sufficiently small that the capacitor CT maintains the power switch TR continuously on or continuously off between successive frame periods when the load 70 is in normal condition.

In the output circuit 25 a thyristor TH is provided with its two main electrodes connected across the gate electrode G and source electrode S of the power switch TR. The thyristor TH is thus connected to the capacitor CT as well as to the power switch TR, and is moreover connected between the capacitor CT and the load 70. The thyristor TH is thermally connected to the MOSFET power switch TR and provides protection means for the power switch TR. Thus when the load 70 is in normal condition the thyristor TH is non-conductive. However, if the power switch TR is on with the load in short-circuit condition, the thyristor TH will become conductive above a predetermined temperature responsive to heat generated in the power switch TR so that the power switch TR then turns off. The thyristor may, for example, be designed to turn on at 150° C. In the context of the present system as has been described above, the power switch TR is turned on and maintained continuously on while the capacitor CT is charged at its high voltage value when the load 70 is in normal condition. If the thyristor TH turns on, then the capacitor CT will discharge to its low voltage value, zero volts, via the thyristor TH and the load 70. Then for so long as the thyristor TH is above its turn on temperature, application of the first drive voltage from the drive voltage circuit 15 to the capacitor CT will fail to charge the capacitor CT and the power switch TR will remain turned off.

Possible modifications to the arrangement described in the previous paragraph are as follows. The thyristor TH could be connected across the capacitor CT, so that when the thyristor TH is conductive the capacitor CT discharges through the thyristor TH directly to ground and not via the load 70. A different semiconductor switch, such as a triac or a bipolar transistor, having a suitable turn on temperature may be used instead of the thyristor. The power switch protection means could, instead of relying on a turn on temperature, be arranged in a suitable circuit so as to become conductive and both turn off the power switch TR and provide a discharge path for the capacitor CT.

The effect of the thyristor TH, or other power switch protection means as described above, on the state of the capacitor CT enables the analogue-to-digital converter 16 and the microprocessor 13 in the master unit 10, with suitable programming of the microprocessor 13, to provide detection means which are operable to detect the condition of the capacitor CT at a time in a selected time slot assigned to the power switch TR when the capacitor CT will be at the low voltage value of zero volts only if the load 70 is in short-circuit condition and hence to detect whether or not the load 70 is in short-circuit condition.

The microprocessor 13 in the master unit will be programmed to ensure that the assigned time slot is selected to test the load 70 for short-circuit condition only when the first drive voltage has been applied in that time slot in the preceding frame period. The detection means may conveniently be operated at the beginning of the selected time slot, but if the first drive voltage is applied for the whole of the selected time slot then the detection means can be operated at any time during that selected time slot.

The frequency at which short-circuit testing of a load 70 is peformed may be selected to meet particular requirements, for example ten tines per second, that is at intervals of ten frame periods. When a load becomes short-circuit there will be a small interval before the thyristor TH turns on and enables this condition to be detected. After this there will be small intervals when the thyristor TH temporarily reverts to its non-conductive condition during which the short-circuit condition of the load will not be detected.

When the complete information handling and control system as described above has been manufactured and installed, for example as part of an automotive vehicle electrical system, then all the items connected to the local slave units 20, that is sensors 50, switches 60 and loads 70 may be tested via the central master intelligent unit 10. In vehicles with driver information displays the test function can be incorporated within the raster unit 10 as a programmable function of the microprocessor 13. Otherwise, the vehicle builder or vehicle servicer can perform these tests with test equipment 80 when connected to the master unit 10. In this case the drive voltage circuit 15 is operated under control of the test equipment 80, each time slot selected for load condition testing is selected and the detection means consisting of the analogue-to-digital converter 16 and the microprocessor 13 are operated under control of the test equipment 80, and the test equipment 80 registers whether or not each load is in short-circuit condition.

Before the complete information handling and control system as described above has been manufactured and installed, for example during the manufacturing stages of an automotive vehicle, then each of the items connected to one local slave unit 20, that is a selection of sensors 50, switches 60 and loads 70 may be tested using test equipment 90 connected to that slave unit 20. In this case a low current signalling link is provided between the local unit 20 and the test equipment 90, the drive voltage circuit 15 is reproduced in and operated under control of the test equipment 90, each time slot selected for load condition testing and the detecting means operated under control of the test equipment 90, and the test equipment 90 registers whether or not each load is in short-circuit condition.

The information handling and control system can have application other than to automotive vehicle electrical systems, for example to domestic appliances such as washing machines or to industrial control systems such as for heating and ventilation.

I claim:

1. An information handling and control system comprising:
  (a) a power switch provided in a local unit and having a control electrode to control a high current to a load;

(b) a low current signalling link provided between the local unit and a remote intelligent unit;
(c) a capacitor provided in the local unit connected to the power switch control electrode;
(d) means provided in the local unit for connecting the capacitor to the signalling link during a time slot assigned to the power switch in successive frame periods;
(e) drive voltage means provided in the intelligent unit for applying a first or a second drive voltage within a said assigned time slot respectively to charge or discharge said capacitor to a high or a low voltage value sufficient respectively to turn the power switch on or off, the capacitor maintaining the power switch continuously on or continuously off between successive frame periods when the load is in normal condition;
(f) power switch protection means connected to the power switch and to the capacitor, the protection means being non-conductive when the load is in normal condition and becoming conductive when the power switch is on with the load in short-circuit condition, such that when the protection means is conductive the capacitor discharges to said low voltage value via the protection means and the power switch turns off; and
(g) detection means provided in the intelligent unit which are operable to detect the condition of the capacitor at a time in a selected said assigned time slot when the capacitor will be at said low voltage value only if the load is in a short-circuit condition and hence to detect whether or not the load is in short-circuit condition.

2. A system as claimed in claim 1, in which the power switch protection means comprises a semiconductor switch thermally connected to the power switch such that the semiconductor switch becomes conductive above a predetermined temperature responsive to heat generated in the power switch.

3. A system as claimed in claim 2, in which the semiconductor switch is a thryistor.

4. A system as claimed in claim 1, in which the protection means is connected such that the capacitor discharges via the protection means and via the load.

5. A system as claimed in claim 1, in which the detection means are operable to detect whether or not the load is in short-circuit condition in selected frame periods at intervals of a selected plurality of frame periods.

6. A local unit for use in a system as claimed in claim 1, said local unit comprising said power switch, said capacitor, said means for connecting the capacitor to the signalling link, and said power switch protection means.

7. In an information handling and control system including:
(a) a power switch provided in a local unit and having a control electrode to control a high current to a load;
(b) a low current signalling link provided between the local unit and a remote intelligent unit;
(c) a capacitor provided in the local unit connected to the power switch control electrode;
(d) means provided in the local unit for connecting the capacitor to the signaling link during a time slot assigned to the power switch in successive frame periods;
(e) drive voltage means provided in the intelligent unit for applying a first or a second drive voltage within a said assigned time slot respectively to charge or discharge said capacitor to a high or a low voltage value sufficient respectively to turn the power switch on or off, the capacitors maintaining the power switch continuously on or continuously off between successive frame periods when the load is in normal condition;
(f) power switch protection means connected to the power switch and to the capacitor, the protection means being non-conductive when the load is in normal condition and becoming conductive when the power switch is on with the load in short-circuit condition, such that when the protection means is conductive the capacitor discharges to said low voltage value via the protection means and the power switch turns off; and
(g) detection means provided in the intelligent unit which are operable to detect the condition of the capacitor at a time in a selected said assigned time slot when the capacitor will be at said low voltage value only if the load is in a short-circuit condition and hence to detect whether or not the load is in short-circuit condition;
a method of testing the load, comprising the steps of:
(A) operating the drive voltage means under control of test equipment connected to the intelligent unit;
(B) selecting each said selected time slot, and operating the detection means under control of said test equipment; and
(C) registering by the test equipment whether or not the load is in short-circuit condition.

8. In an information handling and control system including:
(a) a power switch provided in a local unit and having a control electrode to control a high current to a load;
(b) a low current signaling link provided between the local unit and a remote intelligent unit;
(c) a capacitor provided in the local unit connected to the power switch control electrode;
(d) means provided in the local unit for connecting the capacitor to the signaling link during a time slot assigned to the power switch in successive frame periods;
(e) drive voltage means provided in the intelligent unit for applying a first or a second drive voltage within a said assigned time slot respectively to charge or discharge said capacitor to a high or a low voltage value sufficient respectively to turn the power switch on or off, the capacitor maintaining the power switch continuously on or continuously off between successive frame periods when the load is in normal condition;
(f) power switch protection means provided in the local unit and connected to the power switch and to the capacitor, the protection means being non-conductive when the load is in normal condition and becoming conductive when the power switch is on with the load in short-circuit condition, such that when the protection means is conductive the capacitor discharges to said low voltage value via the protection means and the power switch turns off; and
(g) detection means provided in the intelligent unit which are operable to detect the condition of the capacitor at a time in a selected said assigned time slot when the capacitor will be at said low voltage value only if the load is in a short-circuit condition and hence to detect whether or not the load is in short-circuit condition;

a method of testing the load connected to the power switch in a local unit which includes said power switch, said capacitor, said means for connecting the capacitor to the signaling link, and said power switch protection means, before assembly of the local unit in the system, comprising the steps of:

(A) providing the low current signaling link between the local unit and test equipment;
(B) reproducing the drive voltage means in, and operating the drive voltage means under control of, the test equipment;
(C) reproducing the detection means in the test equipment, and selecting each said selected time slot, and operating the detection means under control of the test equipment; and
(D) registering by the test equipment whether or not the load is in short-circuit condition.

* * * * *